United States Patent
Yu et al.

(10) Patent No.: US 7,538,438 B2
(45) Date of Patent: May 26, 2009

(54) SUBSTRATE WARPAGE CONTROL AND CONTINUOUS ELECTRICAL ENHANCEMENT

(75) Inventors: Cheemen Yu, Madison, WI (US); Ken Jian Ming Wang, San Francisco, CA (US); Chin-Tien Chiu, Taichung (TW); Chih-Chin Liao, Changhua (TW); Han-Shiao Chen, Da-an Township, Taichung County (TW)

(73) Assignee: SanDisk Corporation, Milpitas, CA (US)

( * ) Notice: Subject to any disclaimer, the term of this patent is extended or adjusted under 35 U.S.C. 154(b) by 352 days.

(21) Appl. No.: 11/171,819

(22) Filed: Jun. 30, 2005

(65) Prior Publication Data

US 2007/0004097 A1    Jan. 4, 2007

(51) Int. Cl.
*H01L 23/48* (2006.01)
*H01L 23/52* (2006.01)
*H01L 29/40* (2006.01)

(52) U.S. Cl. .............................. 257/773; 257/E23.068; 257/E23.07; 438/129

(58) Field of Classification Search ............... 438/926, 438/129; 257/773, E23.068, E23.07
See application file for complete search history.

(56) References Cited

U.S. PATENT DOCUMENTS

| | | |
|---|---|---|
| 5,804,882 A | 9/1998 | Tsukagoshi et al. |
| 6,060,349 A | 5/2000 | Peng et al. |
| 6,380,633 B1 | 4/2002 | Tsai |
| 6,534,852 B1 | 3/2003 | Lin et al. |
| 6,599,665 B1 | 7/2003 | Lin et al. |
| 6,608,358 B1 * | 8/2003 | Yamamoto .................. 257/431 |
| 6,664,822 B2 | 12/2003 | Watabe |
| 6,693,357 B1 | 2/2004 | Borst et al. |
| 2002/0043715 A1 | 4/2002 | Takizawa |
| 2003/0104184 A1 | 6/2003 | Hirai et al. |
| 2003/0230791 A1 | 12/2003 | Tsuk et al. |
| 2004/0084205 A1 * | 5/2004 | Chang et al. ................. 174/250 |
| 2004/0102034 A1 * | 5/2004 | Ito et al. ..................... 438/637 |
| 2005/0173807 A1 * | 8/2005 | Zhu et al. ..................... 257/777 |
| 2007/0001285 A1 | 1/2007 | Takiar et al. |
| 2007/0004094 A1 | 1/2007 | Takiar et al. |

OTHER PUBLICATIONS

Office Action dated Aug. 20, 2007 in U.S. Appl. No. 11/171,095.
Office Action dated Mar. 12, 2007 in U.S. Appl. No. 11/170,883.
International Search Report dated Dec. 11, 2006 in International Application No. PCT/US2006/025303.
Response to Office Action dated Nov. 20, 2007, U.S. Appl. No. 11/171,095.
Office Action dated Nov. 29, 2007, U.S. Appl. No. 11/170,883.

(Continued)

*Primary Examiner*—Asok K Sarkar
(74) *Attorney, Agent, or Firm*—Vierra Magen Marcus & DeNiro LLP

(57) ABSTRACT

A dummy circuit pattern is disclosed on a surface of a substrate for a semiconductor package. The dummy circuit pattern includes a plurality of straight line segments and a plurality of interrupt patterns to breakup one or more of the straight line segments. The interrupt patterns are provided so as to not electrically isolate areas of the dummy pattern, thus providing electrical continuity across the dummy circuit pattern.

36 Claims, 8 Drawing Sheets

OTHER PUBLICATIONS

Final Office Action dated Feb. 13, 2008, U.S. Appl. No. 11/171,095.
Response to Office Action dated Feb. 29, 2008, U.S. Appl. No. 11/170,883.
Final Office Action dated Jul. 10, 2008, in U.S. Appl. No. 11/170,883.
Response to Final Office Action dated Sep. 30, 2008 in U.S. Appl. No. 11/170,883.
Response to Office Action filed Jan. 30, 2009 in U.S. Appl. No. 11/171,095.
Chinese Office Action dated Jan. 14, 2009 in Chinese Patent Application No. 200680023617.9.
Office Action dated Mar. 20, 2009 in U.S. Appl. No. 11/171,095.

* cited by examiner

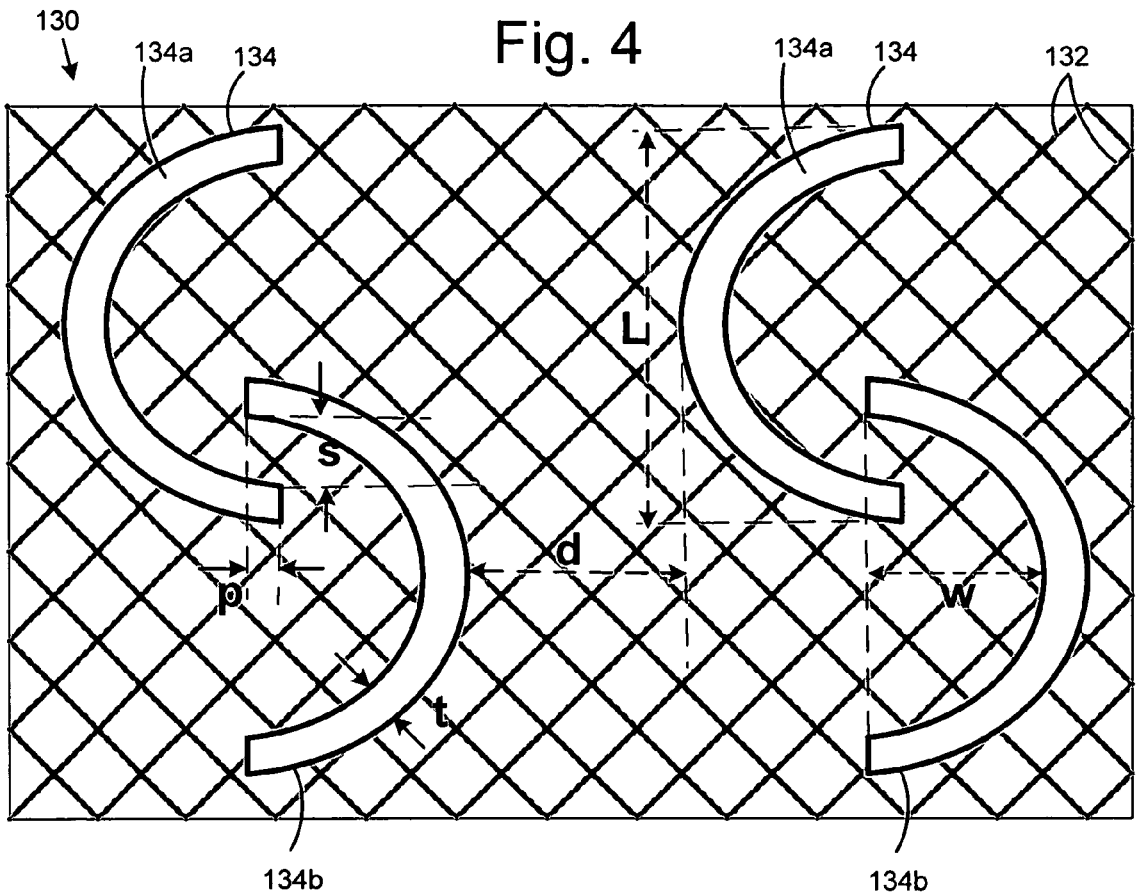
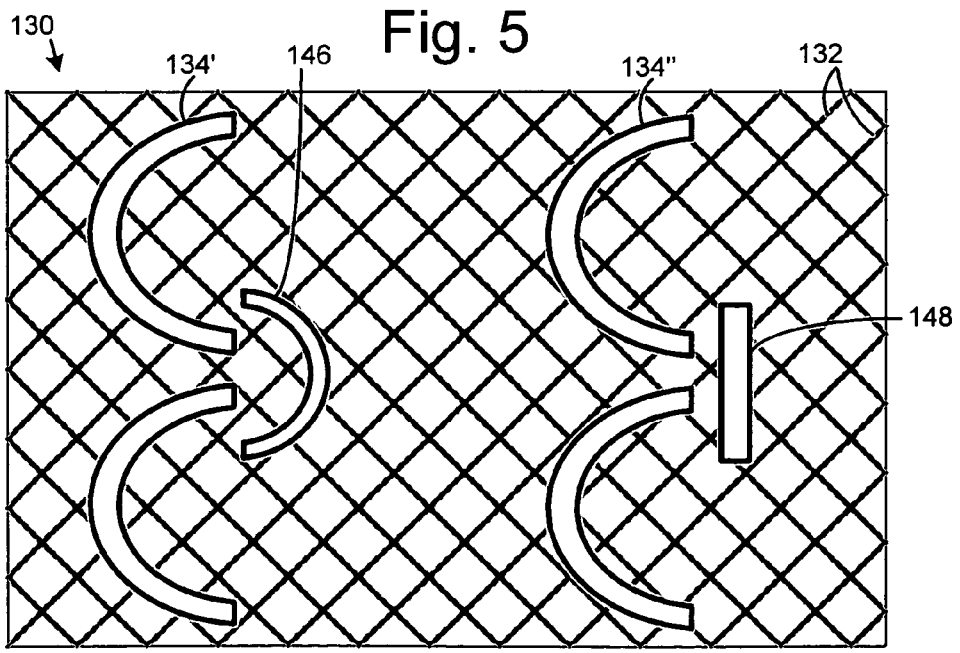

SUBSTRATE WARPAGE CONTROL AND CONTINUOUS ELECTRICAL ENHANCEMENT

CROSS REFERENCE TO RELATED APPLICATION

The present application is related to U.S. patent application Ser. No. 11/170,883, to Hem Takiar et al., entitled, "METHOD OF REDUCING WARPAGE IN AN OVERMOLDED IC PACKAGE," which application is filed concurrently herewith and which application is incorporated by reference in its entirety herein.

BACKGROUND OF THE INVENTION

1. Field of the Invention

Embodiments of the present invention relate to a method of forming a chip carrier substrate to prevent warping while maintaining electrical continuity, and a chip carrier formed thereby.

2. Description of the Related Art

The strong growth in demand for portable consumer electronics is driving the need for high-capacity storage devices. Non-volatile semiconductor memory devices, such as flash memory storage cards, are becoming widely used to meet the ever-growing demands on digital information storage and exchange. Their portability, versatility and rugged design, along with their high reliability and large capacity, have made such memory devices ideal for use in a wide variety of electronic devices, including for example digital cameras, digital music players, video game consoles, PDAs and cellular telephones.

One exemplary standard for flash memory cards is the so-called SD (Secure Digital) flash memory card. In the past, electronic devices such as SD cards have included an integrated circuit ("IC") system consisting of several individually packaged ICs each handling different functions, including logic circuits for information processing, memory for storing information, and I/O circuits for information exchange with the outside world. The individually packaged ICs have been mounted separately on a substrate such as a printed circuit board to form the IC system. More recently, system-in-a-package ("SiP") and multichip modules ("MCM") have been developed where a plurality of integrated circuit components have been packaged together to provide a complete electronic system in a single package. Typically, an MCM includes a plurality of chips mounted side by side on a substrate and then packaged. An SiP typically includes a plurality of chips, some or all of which may be stacked on a substrate and then packaged.

The substrate on which the die and passive components may be mounted in general includes a rigid or soft dielectric base having a conductive layer etched on one or both sides. Electrical connections are formed between the die and the conductive layer(s), and the conductive layer(s) provide an electric lead structure for integration of the die into an electronic system. Once electrical connections between the die and substrate are made, the assembly is then typically encased in a molding compound to provide a protective package.

One surface of a conventional substrate 20 including an etched conductive layer is shown in FIG. 1. The substrate 20 includes a conductance pattern 22 for transferring electrical signals between the various components mounted on the substrate, as well as between the substrate components and the external environment. The conductance pattern may have any number of configurations and occupy various amounts of space on the substrate. In that past it has been recognized that if the conducting layer on a surface of the substrate is completely etched away from the areas not forming part of the conductance pattern, this results in areas of different thermal expansion properties, and a build up of mechanical stresses in the substrate upon heating of the substrate during IC package fabrication. The metal of the conductance pattern tends to expand upon heating, and having some areas with metal and some areas without results is stress generation in the substrate. The same phenomenon was observed where the areas of the conducting layer not forming part of the conducting layer was left completely intact. These stresses tend to warp the substrate. A warped substrate can result in mechanical stresses and cracking of the semiconductor die, either when the semiconductor die is bonded to the substrate, or thereafter.

It is therefore known to etch a so-called dummy pattern on the substrate in areas not used for the conductance pattern. For example, U.S. Pat. No. 6,380,633 to Tsai entitled, "Pattern Layout Structure in Substrate" discloses forming a crosshatch dummy pattern, such as dummy pattern 24 shown in FIG. 1 formed in regions 26, 28, and 30 on substrate 20 not used for conductance pattern 22. Dummy pattern 24 provides improved semiconductor yields by reducing disparate thermal properties between areas on the substrate having a conductance pattern and areas on the substrate which do not.

The inventors of the present invention have further realized that thermal stresses still result when the dummy pattern 24 is laid down in long straight lines. In particular, it has been found that thermal stresses accumulate over a straight segment of a dummy pattern trace, which thermal stresses increase the longer the length of the straight segment. U.S. Pat. No. 6,864,434 to Chang et al. entitled "Warpage-Preventive Circuit Board And Method For Fabricating The Same" discloses a crosshatch dummy pattern as proposed in Tsai, but Chang et al. break up the dummy pattern into a plurality of regions. While Chang et al. represent an improvement over Tsai, Chang et al. still disclose a system of straight line segments on the substrate which result in stress in the substrate. As semiconductor die become thinner and more delicate, it becomes even more important to minimize the stresses within the substrate.

Moreover, another consequence of the breaking the dummy pattern into a plurality of smaller isolated regions as in Chang et al. is that each region becomes electrically isolated from each other region. Thus, if a static or other electrical charge builds in one region, it may not have a path to ground. Accumulation of these charges can damage or ruin a semiconductor package.

SUMMARY OF THE INVENTION

Embodiments of the present invention, roughly described, relate to a method of forming a chip carrier substrate to prevent warping while maintaining electrical continuity, and a chip carrier formed thereby. In embodiments, this is accomplished by a dummy circuit pattern on the substrate including a plurality of straight line segments and a plurality of interrupt patterns to breakup one or more of the straight line segments. The straight line segments may be crosshatched lines, but other configurations are contemplated. In an embodiment, the interrupt pattern includes a plurality of "C"-shaped sections, with a pair of such sections being vertically aligned, one forward and one backward, and partially overlapping.

A plurality of the "C"-shaped sections may be strung together across a length of a dummy circuit pattern. The "C"-shaped sections serve to breakup the straight lengths included in the crosshatch pattern. The offset "C"-shaped sections provide the further advantage of allowing electrical continuity throughout a portion or the entire dummy circuit pattern. That is, the "C"-shaped sections do not electrically isolate any single portion of the crosshatch section from another. Thus, electrical continuity across the dummy circuit pattern in maintained.

The "C"-shaped sections are one of many configurations for the interrupt pattern. Other embodiments include additional and varied arcuate shapes. The interrupt pattern may further include oval or elliptical patterns, each having interior patterns that may for example be dots of material, or mesh patterns.

BRIEF DESCRIPTION OF THE DRAWINGS

FIG. 4 is an enlarged partial view of the dummy circuit pattern according to embodiments of the present invention.

FIG. 5 is a top view of a substrate including a dummy circuit pattern according to an alternative embodiment of the present invention.

DETAILED DESCRIPTION

Embodiments of the invention will now be described with reference to FIGS. 2-13, which relate to a method of forming a reduced warpage semiconductor package while maintaining electrical continuity, and the semiconductor package formed thereby. It is understood that the present invention may be embodied in many different forms and should not be construed as being limited to the embodiments set forth herein. Rather, these embodiments are provided so that this disclosure will be thorough and complete and will fully convey the invention to those skilled in the art. Indeed, the invention is intended to cover alternatives, modifications and equivalents of these embodiments, which are included within the scope and spirit of the invention as defined by the appended claims. Furthermore, in the following detailed description of the present invention, numerous specific details are set forth in order to provide a thorough understanding of the present invention. However, it will be clear to those of ordinary skill in the art that the present invention may be practiced without such specific details.

Figure 1:
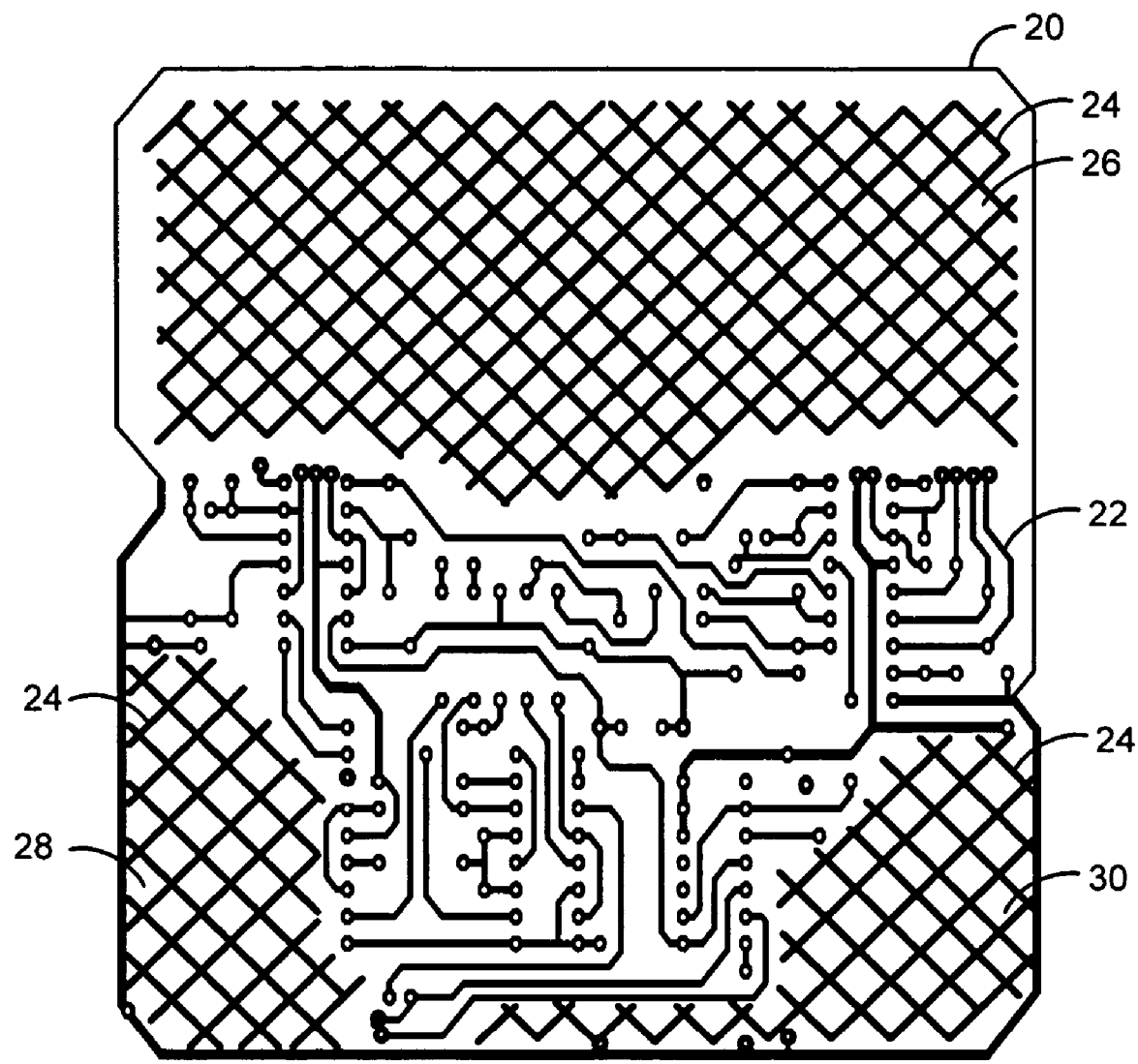
FIG. 1 is a top view of a prior art substrate including a crosshatch dummy circuit pattern.
Figure 2:
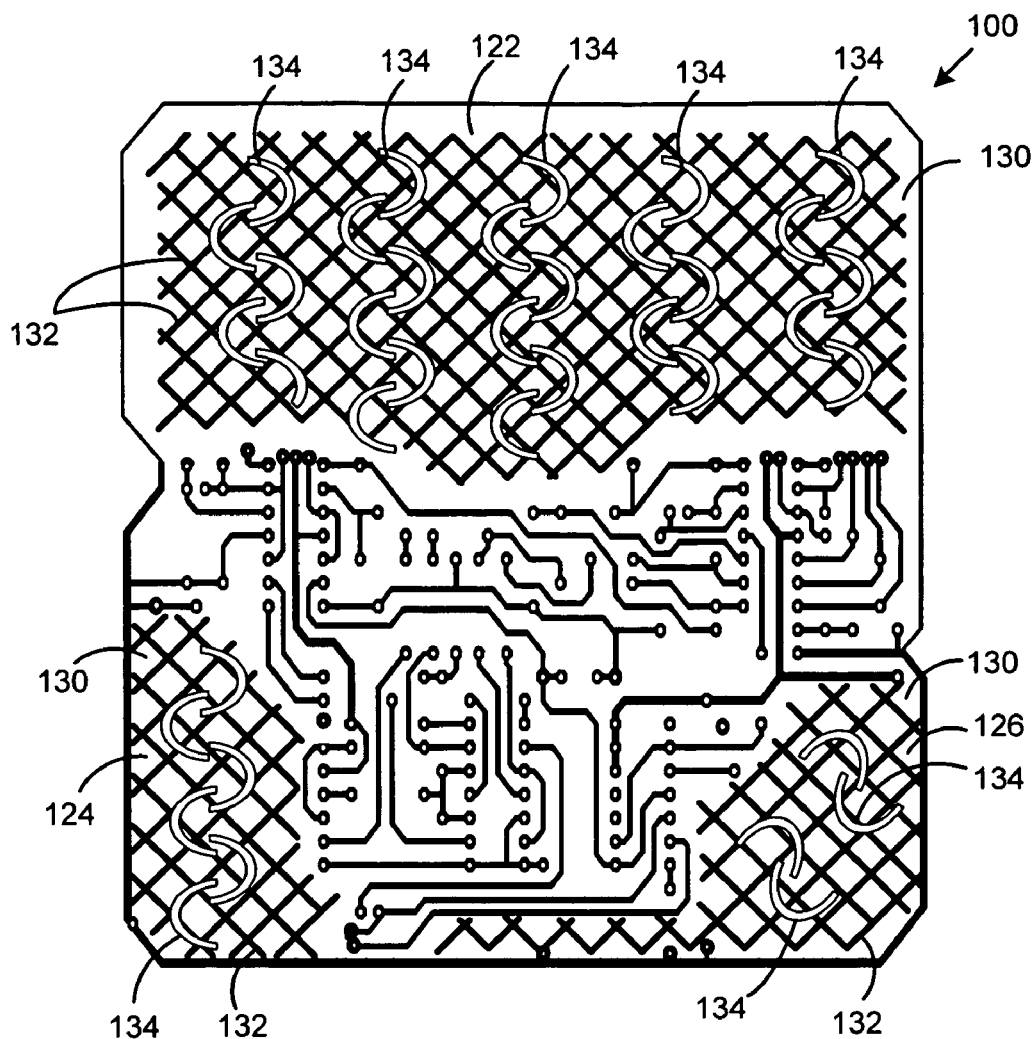
FIG. 2 is a top view of a substrate including a conductance pattern and a dummy circuit pattern according to embodiments of the present invention in regions not occupied by the conductance pattern.
Figure 3:
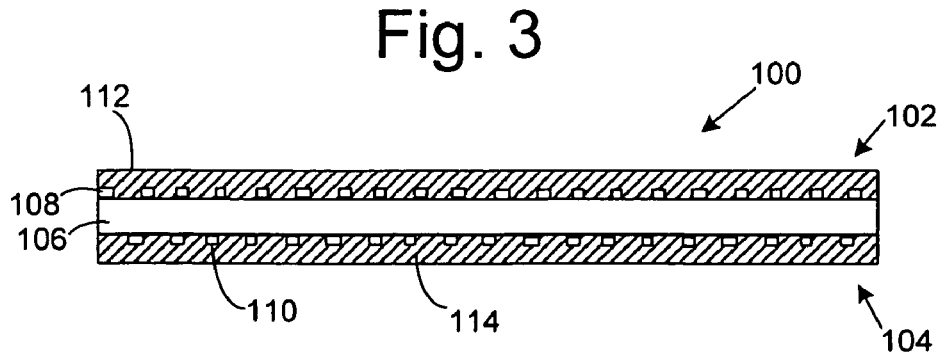
FIG. 3 is a cross-sectional view of the substrate shown in FIG. 2.

FIG. 2 is a top view of a chip carrier substrate 100, and FIG. 3 is a cross-sectional view through a plane normal to the top and bottom surfaces of substrate 100. As seen in FIG. 3, substrate 100 may have a top surface 102 and a bottom surface 104. Substrate 100 may be formed of an electrically insulative core 106 having a top conductive layer 108 formed on a top surface of the core and a bottom conductive layer 110 formed on a bottom surface of the core. The core may be formed of various dielectric materials such as for example, polyimide laminates, epoxy resins including FR4 and FR5, bismaleimide triazine (BT), and the like. Although not critical to the present invention, core 106 may have a thickness of between 40 microns ($\mu$m) to 200 $\mu$m, although thickness of the core may vary outside of that range in alternative embodiments. The core may be ceramic or organic in alternative embodiments.

The conductive layers 108 and 110 may be formed of copper, copper alloy or other low resistance electrical conductor, and may be patterned in a conductance pattern and dummy circuit according to embodiments of the present invention as explained hereinafter. The layers 108 and/or 110 may have a thickness of about 10 $\mu$m to 24 $\mu$m, although the thickness of the layers 108 and 110 may vary outside of that range in alternative embodiments. Once patterned, the top and bottom conductive layers may be laminated with a solder mask 112, 114, respectively, as is known in the art.

Substrate 100 may be patterned and configured for use in a wide variety of semiconductor packages. One such package is a so-called land grid array (LGA) semiconductor package used, for example, in SD Flash Memory Cards. However, it is understood that the dummy circuit pattern explained hereinafter may be used on any substrate in which a conductance pattern may be formed and assembled into a semiconductor device.

Referring to FIG. 2, one or both of the conductive layers 108 and 110 may be etched or otherwise processed as explained hereinafter so as to include a conductance pattern 120 to provide electrical connection between components mounted to substrate 100, as well as between components on substrate 100 and external devices. In embodiments including conductance patterns on both the top surface 102 and bottom surface 104 of substrate 100, vias (not shown) may be provided to transmit electrical signals between the conductance patterns in different layers.

Substrate 100 further includes a plurality of regions 122, 124, 126 not having a conductance pattern, referred to herein as dummy circuit regions. A dummy circuit pattern 130 according to embodiments of the present invention may be formed in one or more of the dummy circuit regions 122, 124, and 126. It is understood that the size and shape of substrate 100, as well as the size and shape of conductance pattern 102 may vary greatly in alternative embodiments of the present invention so as to define one or more dummy circuit regions of any size or shape. Dummy circuit pattern 130 may be provided in any one or more of these dummy circuit regions. In embodiments, a dummy circuit pattern according to any of the embodiments described hereinafter may be provided on both sides of the substrate, even where a conductance pattern is provided only on one side of the substrate. It is conceivable that a substrate may be used in a semiconductor device which does not include a conductance pattern on either first or second opposed surfaces of the substrate. Such a substrate may be formed with a dummy circuit pattern according to embodiments of the present invention In each of the embodiments described hereinafter, the dummy circuit pattern includes one or more interrupt patterns provided to interrupt a straight segment of the dummy circuit pattern and divide the straight segment into separate segments. The interrupt patterns are provided in a given frequency on the dummy circuit pattern in the one or more dummy circuit regions. Frequency refers to the number of interrupt patterns included within a dummy circuit pattern per a unit of area on the substrate.

The stress level within a straight segment in a portion of a dummy circuit pattern will be linearly or non-linearly related to the length of that straight segment when the substrate is heated. In general, the longer the length, the greater the stress upon heating. The interrupt patterns are provided to breakup, or interrupt, one or more of the straight line segments included in the dummy circuit pattern. The length of the straight segments in a dummy circuit pattern is set by increasing or decreasing the number of interrupt patterns included in a given area of the dummy circuit pattern. The higher the frequency of the interrupt patterns within a dummy circuit pattern, the shorter will be the lengths of the straight line segments between the interrupt patterns.

With regard to the maximum length of a straight segment in any portion of a dummy circuit pattern according to the embodiments described hereinafter, the length of a straight segment may be set to maintain the stresses within that straight segment below a desired level. In particular, the stress per unit length of a straight segment of a portion of the dummy circuit pattern may be determined experimentally and/or by known physical characteristics and behavior of the substrate materials as a function of the type of the materials used, the thicknesses of the materials used and the temperature range to which the materials are to be subjected. Other characteristics may be included in the analysis.

Given this information, the maximum length of a straight segment in a portion of the dummy circuit pattern may be selected to maintain the stresses within that segment below any desired, predetermined level. Stated another way, with a knowledge of the stress build-up per unit length, a desired maximum stress may be selected, and then the length of all or a portion of the straight segments in a dummy circuit may be set to maintain a stress at or below the selected stress level. As indicated, the length of a straight segment is determined by the frequency of the interrupt patterns on the dummy circuit pattern.

It is understood that a quantitative analysis of stress per unit length need not be performed, and the maximum length of a straight segment may instead be estimated or otherwise correlated to stress in embodiments of the invention. It is also understood that a dummy circuit pattern may include straight segments in which stresses exceeding a predetermined maximum may result in those segments upon heating in embodiments of the invention.

Referring still to FIG. 2, one or more of the dummy circuit regions 122, 124, and 126 may include a dummy circuit pattern 130 comprised of crosshatch sections 132, the lengths of which are periodically interrupted by interrupt patterns 134. Crosshatch section 132 may include etched portions as found in the prior art, such as for example disclosed in the above-described U.S. Pat. No. 6,380,633 to Tsai entitled, "Pattern Layout Structure in Substrate," which patent is incorporated by reference herein in its entirety. It is understood that section 132 need not have a crosshatch configuration, and may comprise any configuration generally including straight line segments etched into layers 108 and/or 110.

An enlarged view of an interrupt pattern 134 according to an embodiment of the present invention is shown in FIG. 4. In an embodiment, interrupt pattern 134 includes a pair of "C"-shaped sections, one forward (134a) and one backward (134b). The sections 134a and 134b each have end portions which lie adjacent to each other as shown in FIG. 4. While the term "interrupt pattern" refers to a pair of a "C"-shaped sections in embodiments of the invention, it is understood that the term "interrupt pattern" may refer to a single "C"-shaped section, or other shapes as explained hereinafter. The dimensions and relative spacing between "C"-shaped sections may vary in alternative embodiments. However, in one embodiment of the invention, a single "C"-shaped section may have a length, L, of 1500 μm and a width, W, of 750 μm.

Vertically adjacent "C"-shaped sections 134a and 134b may be vertically offset from each other a distance, s, of about 500 μm. Vertically adjacent "C"-shaped sections 134a and 134b may horizontally overlap each other a distance p of about 200 μm. An interrupt pattern 134 may be spaced a distance, d, of 1500 μm from a next horizontally adjacent interrupt pattern 134. The terms "vertically" and "horizontally" apply to an embodiment where the "C"-shaped sections 134a and 134b are vertically oriented. It is understood that the "C"-shaped sections 134a, 134b may have orientations other than vertical in alternative embodiments of the present invention such as for example shown in circuit carrying region 126 of FIG. 2. Each "C"-shaped section 134a, 134b may have a thickness, t, which may be 100 μm or the minimum manufacturable thickness.

In embodiments, crosshatch pattern 132 may be comprised of etched lines on the substrate which are 125 μm thick and spaced from each other 125 μm. As indicated, the crosshatch pattern 132 may comprise other shapes in further embodiments of the present invention. Such other shapes may include straight lines that intersect or do not intersect, and may also include lines that are not straight.

It is understood that each of the above-described dimensions is by way of example only, and is not to be considered limiting on the invention. Each of the above-described dimensions may vary above and below dimensions given in alternative embodiments of the present invention.

A plurality of "C"-shaped sections 134a, 134b may be strung together along the vertical length of a dummy circuit pattern 130. As indicated above, interrupt pattern 134 need not be vertically aligned in embodiments of the invention, and may be provided horizontally, or at some other orientation, across a dummy circuit pattern 130.

Each of the "C"-shaped sections 134a, 134b is shown having an outline of material from conductive layers 108, 110 around the outer periphery of each of the sections 134a, 134b. It is understood that each of the "C"-shaped sections 134a, 134b may not have an outline of material in alternative embodiments. In such embodiments, the "C"-shaped sections would simply be open space on the substrate where the layers 108, 110 have been etched away in the shape of the interrupt pattern 134.

The "C"-shaped sections 134a, 134b of an interrupt pattern 134 serve to breakup the straight lengths included in crosshatch pattern 132. As indicated above, the maximum length of a straight segment in crosshatch pattern 132 may be controlled to maintain the stresses within the segments of crosshatch pattern 132 within predetermined desired levels.

The offset "C"-shaped sections 134a, 134b of interrupt pattern 134 provide the further advantage of allowing electrical continuity throughout the entire dummy circuit pattern 130. That is, in embodiments of the invention, the "C"-shaped sections 134a, 134b breakup the lengths of straight segments in crosshatch pattern 132, while at the same time not electrically isolating any single portion of crosshatch section 132 from another. Thus, electrical continuity across the dummy circuit pattern in maintained, a continuous path to ground may be provided and the build up of static charge is avoided.

Moreover, the interrupt patterns 134 provide a good balancing of the material of layers 108, 110 after the etching process. In particular, it is desirable to avoid etching conductive layers 108, 110 in straight lines that match up with the axes of semiconductor die or other components mounted on the substrate over such straight lines. Such aligned straight lines have been found to result in stresses in the semiconductor die or other component mounted over such straight lines. As the thicknesses of semiconductor die continue to decrease, such stresses can result in cracking of the die. Interrupt patterns 134 provide good copper balancing (where layers 108, 110 are formed of copper) on the substrate, and avoid stress generation within semiconductor die and/or other components mounted on the substrate.

It is understood that the "C"-shaped sections 134a, 134b are one of many configurations for interrupt pattern 134. It is understood that instead of a "C"-shape, pattern 134 may be a variety of other shapes, including a variety of other adjacent, non-intersecting arcuate shapes. For example, the "C"-shaped sections may be oriented in the same direction, such as in interrupt patterns 134' and 134" in FIG. 5. The individual arcs forming the arcuate shapes may have bridging sections, such as arcuate bridging section 146 and linear bridging section 148. Other shapes are contemplated.

FIGS. 6-9 show further embodiments of an interrupt pattern 134 formed in dummy circuit pattern 130 to interrupt the straight line segments of crosshatch pattern 132. The interrupt patterns 134 shown in FIGS. 6-9 may in general include the same length and width as a pair of "C"-shaped sections 134a and 134b, and the interrupt patterns 134 shown in FIGS. 6-9 may be used in the same locations as interrupt pattern 134 of FIG. 2. In general, the interrupt pattern 134 shown in FIGS. 6-9 includes an oval, elliptical or other shape, and includes an interior pattern of varying configurations.

Figure 6:
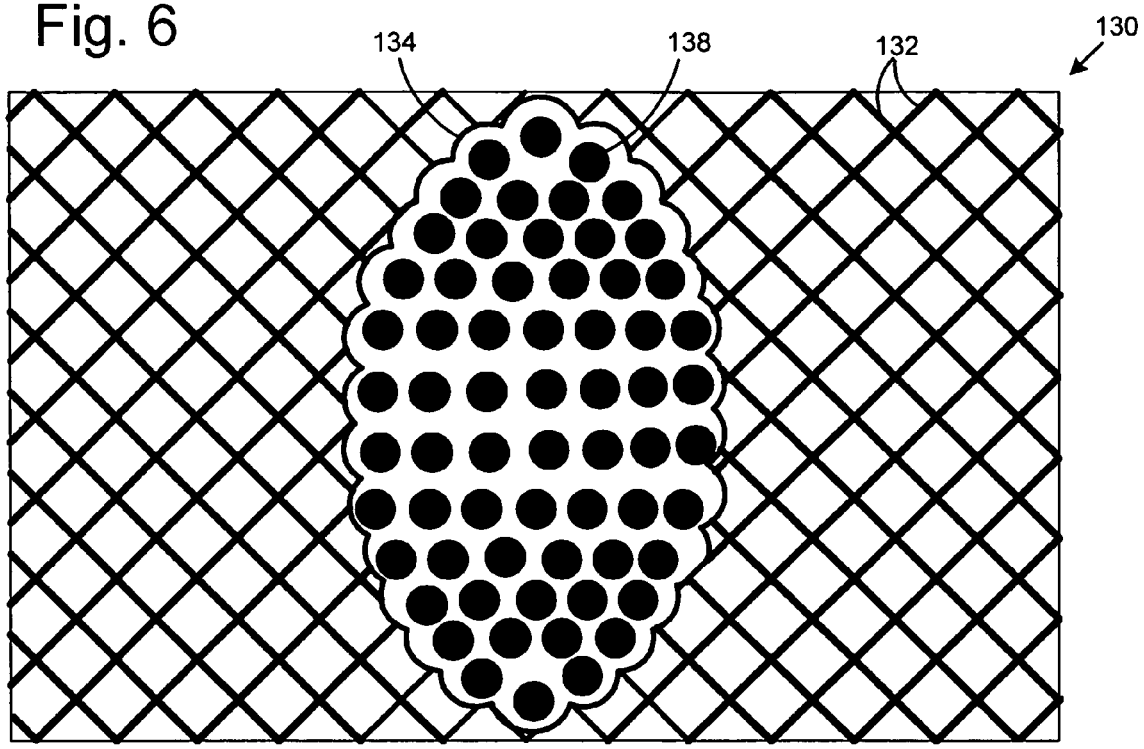
FIG. 6 is a top view of a substrate including a dummy circuit pattern according to a second alternative embodiment of the present invention.

For example, as shown in FIG. 6, interrupt pattern 134 may include a plurality of dots 138, which dots are material from layers 108, 110 which is left behind after the etching process. The dots may be solid as shown, or the dots may have etched lines across their surface, or otherwise have material removed so as not to be solid in alternative embodiments. The number and size of dots 138 within pattern 134 may vary in alternative embodiments of the present invention. While the dots are shown as circular in FIG. 6, it is understood that dots 138 may be other shapes in alternative embodiments, including for example ovals, ellipses, and various shaped polygons. The dots within interrupt pattern 134 may be irregularly shaped in further embodiments. The interrupt pattern 134 in FIG. 6 is shown with an outline of material from layers 108, 110 left behind after the etching process is completed. It is understood that the outline of material may be omitted in alternative embodiments of the present invention.

Figure 7:
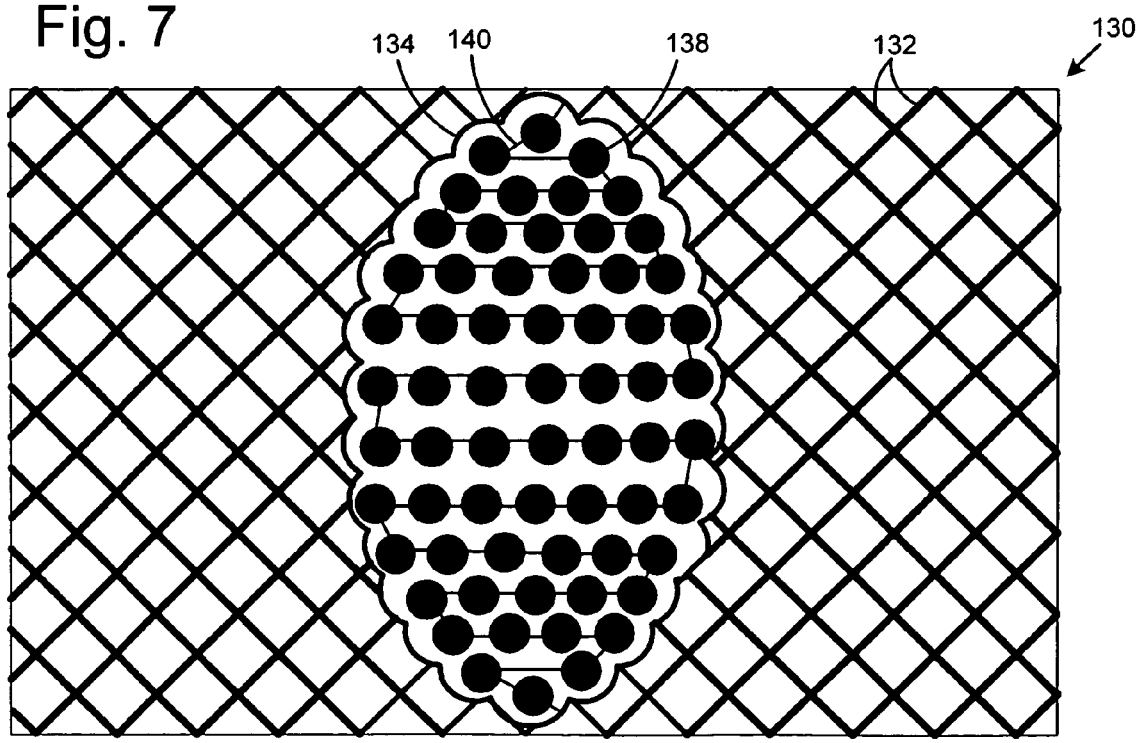
FIG. 7 is a top view of a substrate including a dummy circuit pattern according to a third alternative embodiment of the present invention.

Each of the dots 138 may be isolated from each of the other dots 138 within pattern 134. Alternatively, as shown in FIG. 7, each of the dots may be connected to each other by etched lines 140 within the interrupt pattern that connects each of the dots. Etched lines 140 may be provided in a controlled pattern between each of the dots 138, or the lines 140 may be etched at random within interrupt pattern 130. Etched lines 140 allow electrical continuity across interrupt pattern 134.

Figure 8:
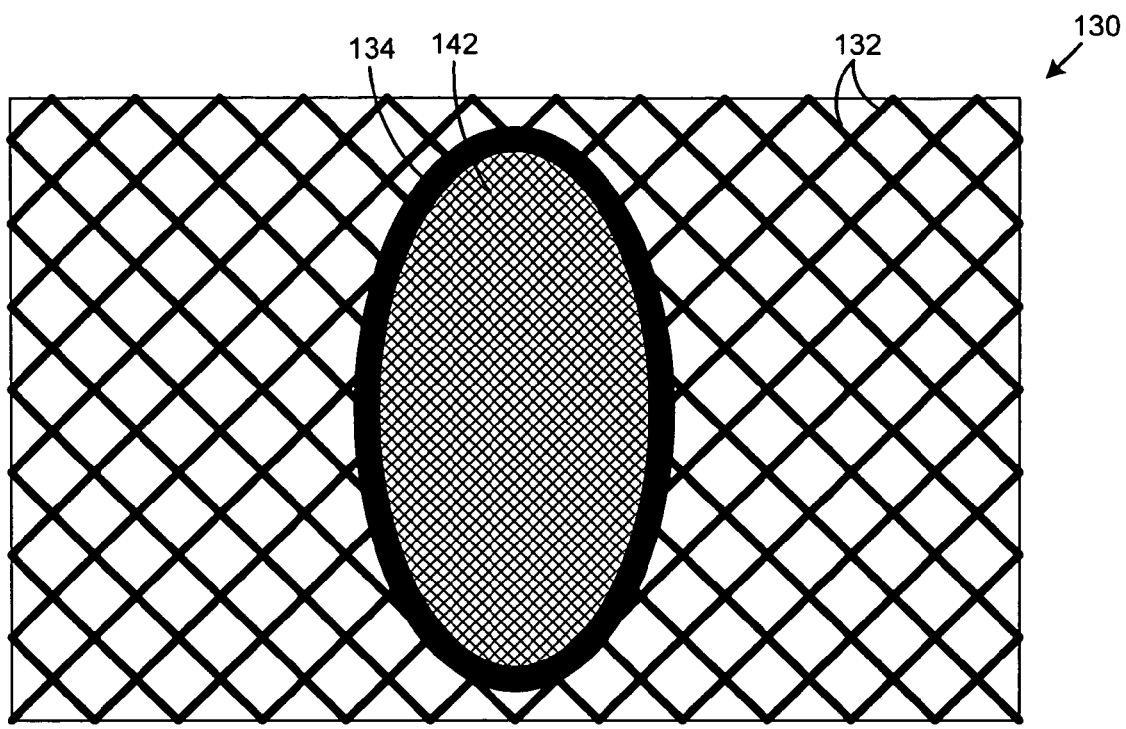
FIG. 8 is a top view of a substrate including a dummy circuit pattern according to a fourth alternative embodiment of the present invention.
Figure 9:
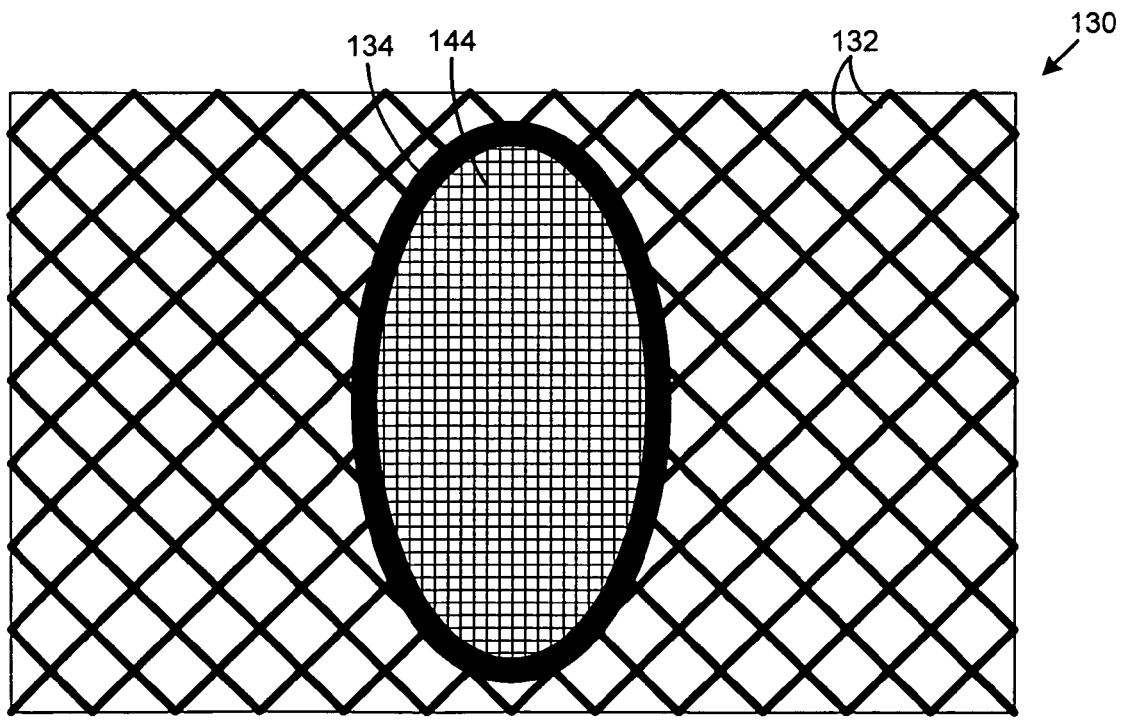
FIG. 9 is a top view of a substrate including a dummy circuit pattern according to a sixth alternative embodiment of the present invention.
Figure 10:
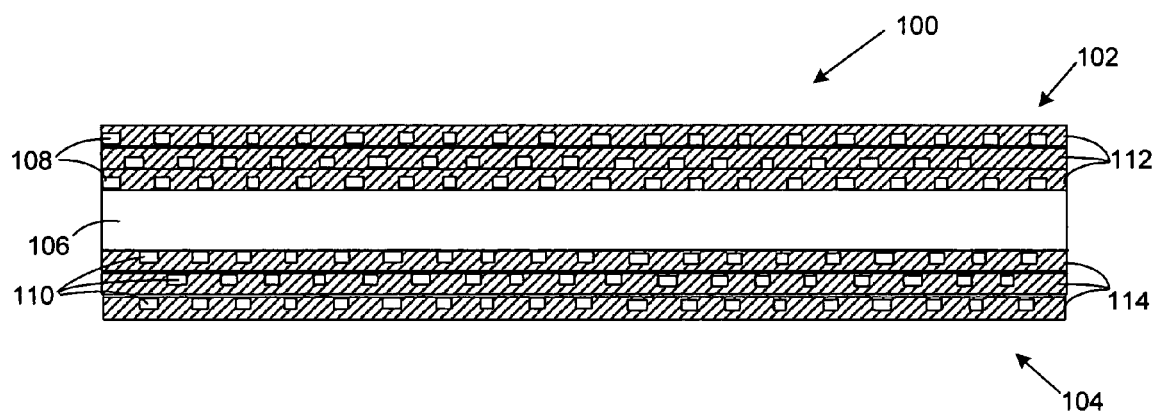
FIG. 10 is a cross-sectional side view of a substrate including a plurality of conductive layers, one or more of which may include a dummy circuit pattern as shown in any of the above-described embodiments.

FIGS. 8 and 9 show a further alternative embodiment of an interrupt pattern 134 which may be used in the same manner as the interrupt patterns 134 shown in FIGS. 2 and 5-7. The interrupt pattern 134 in FIG. 8 includes an interior crosshatch pattern 142 having a different pitch than crosshatch pattern 132 of dummy circuit layer 130. The crosshatch lines within pattern 142 may be generally parallel to the crosshatch lines in pattern 132. In an embodiment, the etched lines of crosshatch pattern 142 may, for example, be 50 µm wide and spaced from each other 125 µm. This thickness and spacing of the lines forming crosshatch pattern 142 may vary in alternative embodiments of the present invention. The pattern 134 shown in FIG. 8 includes an outline of etched material left behind on the substrate after the etching process is completed. It is understood that the outline may be omitted in alternative embodiments of the present invention.

The interrupt pattern 134 shown in FIG. 9 is similar to the interrupt pattern 134 shown in FIG. 8 with the exception that pattern 134 in FIG. 9 includes an internal mesh pattern 144 having lines formed generally at oblique angles to the line segments forming crosshatch pattern 132. It is understood that the internal mesh pattern 144 may have lines of any orientation relative to crosshatch pattern 132.

It is understood that a variety of other patterns may be included within the interior of the interrupt patterns shown in FIGS. 6-9. Moreover, the general shape of the interrupt patterns in FIGS. 6-9 may be other than oval or elliptical in alternative embodiments. Such additional shapes include for example circular, or various shaped polygons. The overall shape of the interrupt pattern may be irregularly shaped in further embodiments. Each one of these different outer shapes may include interior shapes according to the embodiments set forth above. It is understood that the different dummy circuit regions 122, 124 and 126 may include different interrupt patterns, and that a single dummy circuit region may include different interrupt patterns.

A plurality of layers 108 and 110 including dummy circuit pattern 130 may be provided on the respective upper and lower surfaces of core 106 in substrate 100 in embodiments of the invention. Such an embodiment is shown in cross-section in FIG. 10. In the embodiment shown, core includes three layers 108, each laminated by a layer of solder mask 112 on the top surface 102, and substrate 100 includes three layers 110, each laminated by a layer solder mask 114 on lower surface 104. One or more of the layers 108 and 110 may include a conductance pattern 120 and any of the above-described embodiments of a dummy circuit pattern 130. The interrupt patterns 134 in the various layers 108 may align with each other or not align with each other in embodiments of the invention. The same is true for the interrupt patterns formed in layers 110.

Figure 11:
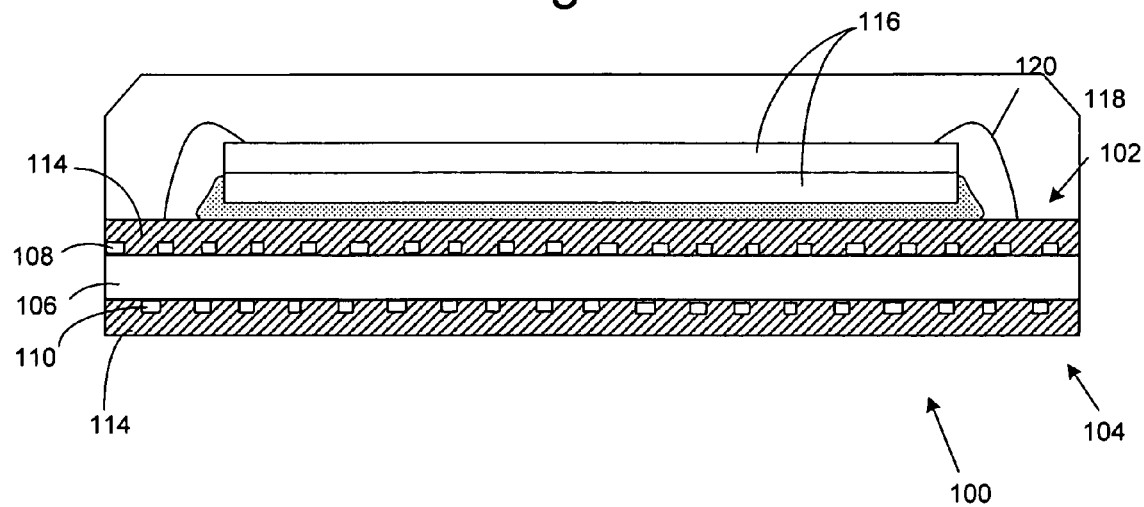
FIG. 11 is a cross-sectional side view of a semiconductor package including a substrate having a dummy circuit pattern according to an embodiment of the present invention.
Figure 12:
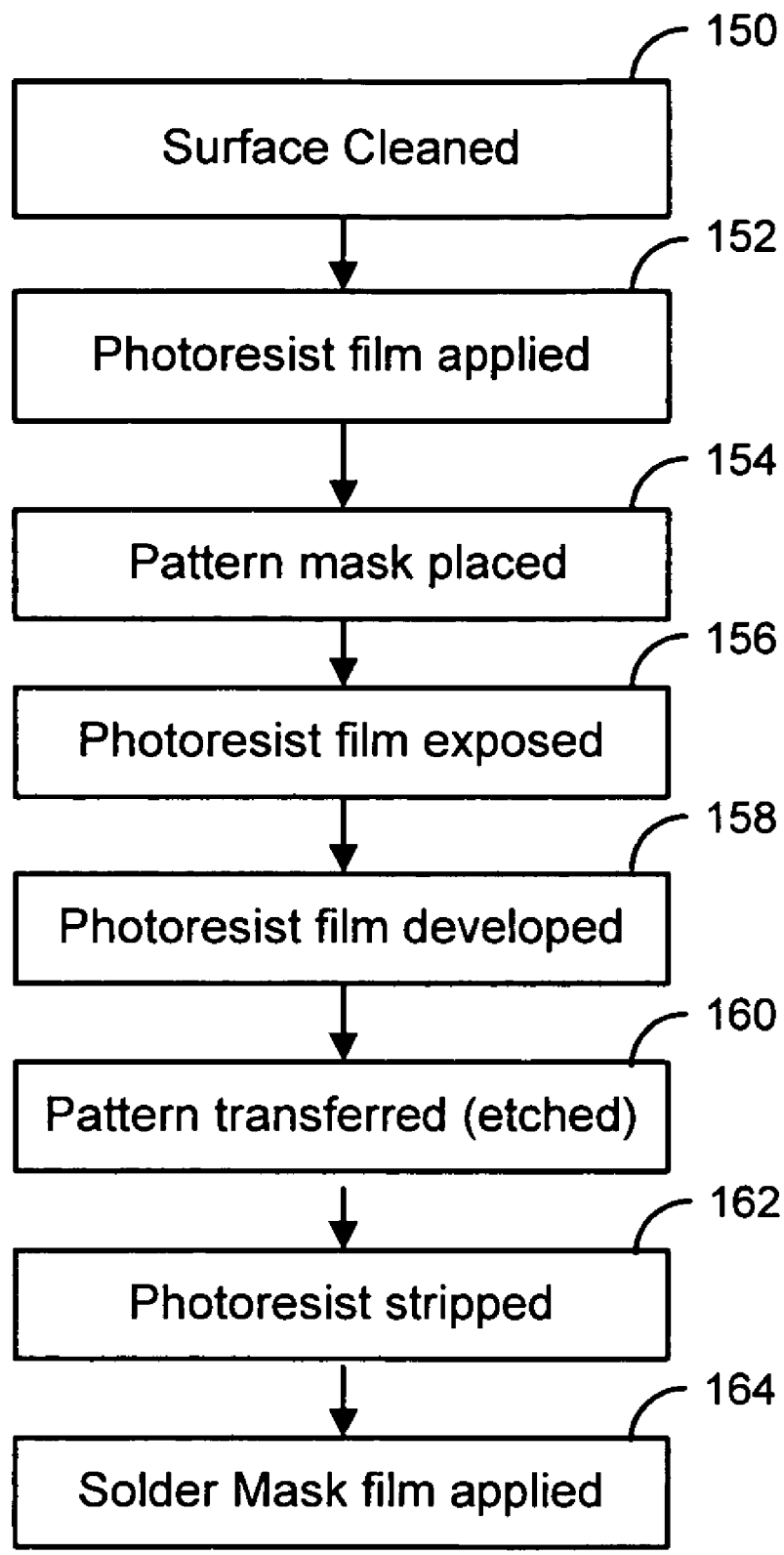
FIG. 12 is a flowchart illustrating a process for fabricating a conductance pattern and dummy circuit pattern on a substrate.

FIG. 11 is a cross-sectional view of a semiconductor package 182 which may be formed with a substrate 100 including a dummy circuit pattern according to any of the above-described embodiments. Although not critical to the present invention, FIG. 11 shows two stacked semiconductor die 184 on the top surface 102 of substrate 100. Embodiments of the invention may operate with a single die or between three and eight or more stacked die in an SiP, MCM, or other type of arrangement. Again, while not critical to the present invention, the one or more die 184 may be a flash memory chip (NOR/NAND), SRAM, or DDT, and/or a controller chip such as an ASIC. Other silicon chips are contemplated.

The dummy circuit pattern according to embodiments of the present invention described above controls and/or minimizes mechanical stresses on, and warping of, the substrate 100 as well as providing electrical continuity across the dummy circuit pattern and good material balancing. These features in turn result in good control and minimization of the stresses seen by die 184, and improvement of overall yields.

In addition to reducing stress and warpage, the dummy circuit pattern according to the various embodiments described above may also serve electrical functions. The dummy circuit pattern may provide a path to ground (VSS) or be connected to a power source (VDD) to supply power to the semiconductor die and/or other components mounted on the substrate. Alternatively, the dummy circuit pattern may carry signals to and/or from the semiconductor die and substrate components. In further embodiments, the dummy circuit pattern may be "floating," i.e., it has no electrical function.

There are a number of known processes for forming the conductance pattern 120 and various embodiments of the dummy circuit pattern on substrate 100. One such process is explained with reference to the flowchart of FIG. 12. The surfaces of conductive layers 108 and 110 are cleaned in step 150. A photoresist film is then applied over the surfaces of layers 108 and 110 in step 152. A pattern photomask containing the outline of the electrical conductance pattern and the dummy circuit pattern is then placed over the photoresist film in step 154. The dummy circuit pattern and the conductance pattern may be formed on the photomask in a known process. The photoresist film is exposed (step 156) and developed (step 158) to remove the photoresist from areas on the conductive layers that are to be etched. The exposed areas are next etched away using an etchant such as ferric chloride in step 160 to define the conductance and dummy circuit patterns on the core. Next, the photoresist is removed in step 162, and the solder mask layer is applied in step 164.

Figure 13:
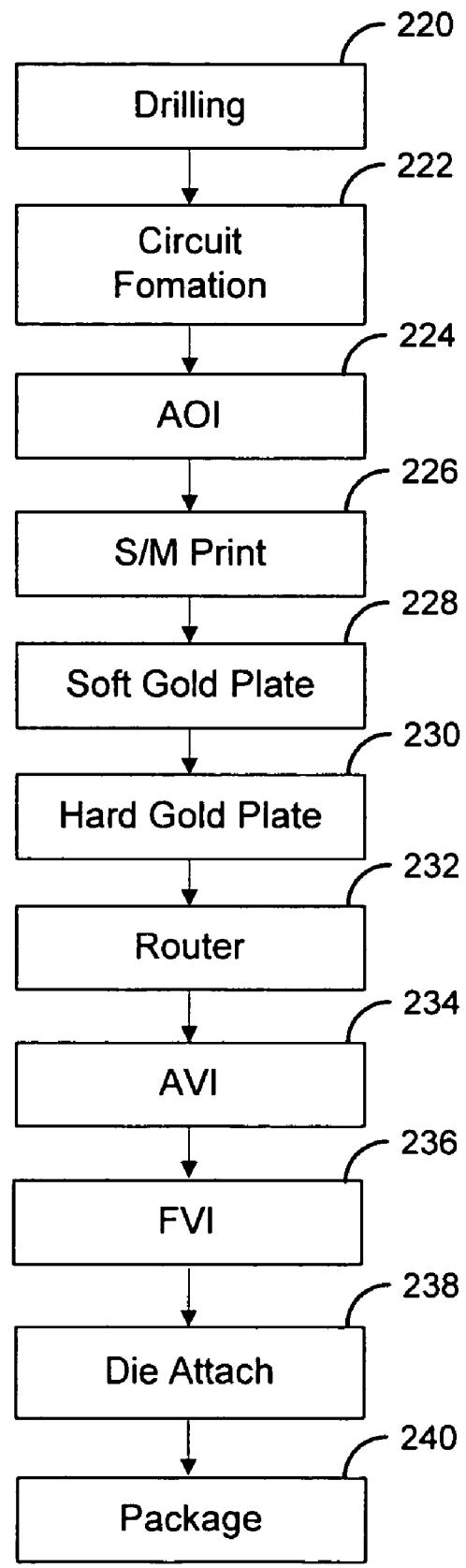
FIG. 13 is an overall flowchart of a process for fabricating a semiconductor package including a dummy circuit pattern according to embodiments of the present invention.

An overall process for forming the finished die package 182 is explained with reference to the flow chart of FIG. 13. The substrate 100 starts out as a large panel which is separated into individual substrates after fabrication. In a step 220, the panel is drilled to provide reference holes off of which the position of the respective substrates is defined. The conductance pattern and dummy circuit pattern are then formed on the respective surfaces of the panel in step 222 as explained above. The patterned panel is then inspected and tested in step 224. Once inspected, the solder mask is applied to the panel in step 226. A router then separates the panel into individual substrates in step 228. The individual substrates are then inspected and tested again in an automated step (step 230) and in a final visual inspection (step 232) to check electrical operation, and for contamination, scratches and discoloration. The substrates that pass inspection are then sent through the die attach process in step 234, and the substrate and dice are then packaged in step 236 in a known injection mold process to form a JEDEC standard (or other) package. It is understood that the die package 182 including a dummy circuit pattern may be formed by other processes in alternative embodiments.

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

We claim:

1. A method of controlling stress while maintaining electrical continuity within at least a portion of a dummy circuit pattern formed on a surface of a substrate for a semiconductor package comprising the steps of:
    (a) forming a plurality of segments in the surface of the substrate for alleviating stress within the substrate; and
    (b) forming a plurality of patterned breaks through portions of the plurality of segments on the surface to breakup one or more of the segments, the plurality of patterned breaks allowing electrical continuity from one edge of the entire dummy circuit pattern to the opposite edge of the entire dummy circuit pattern.

2. A method of controlling stress while maintaining electrical continuity within at least a portion of a dummy circuit pattern as recited in claim 1, the step (b) of forming a plurality of patterned breaks on the surface comprising the step of forming one or more arcuate shapes on the surface.

3. A method of controlling stress while maintaining electrical continuity within at least a portion of a dummy circuit pattern as recited in claim 1, the step (b) of forming a plurality of patterned breaks on the surface comprising the step of forming a plurality of adjacent, non-intersecting "C"-shaped sections on the surface.

4. A method of controlling stress while maintaining electrical continuity within at least a portion of a dummy circuit pattern as recited in claim 1, the step (b) of forming a plurality of patterns on the surface comprising the step of forming a pattern having an interior configuration different than the plurality of segments formed in said step (a).

5. A dummy circuit pattern formed on a surface of a substrate for a semiconductor package, comprising:
    a plurality of segments; and
    a plurality of interrupt patterns for breaking up one or more of the segments, the plurality of interrupt patterns allowing travel of an electric charge throughout the entire dummy circuit pattern.

6. A dummy circuit pattern as recited in claim 5, the plurality of interrupt patterns on the surface including one or more arcuate shapes.

7. A dummy circuit pattern as recited in claim 5, the plurality of interrupt patterns on the surface including one or more "C"-shaped sections.

8. A dummy circuit pattern as recited in claim 5, the plurality of interrupt patterns on the surface including a plurality of adjacent, non-intersecting "C"-shaped sections.

9. A dummy circuit pattern as recited in claim 5, the plurality of interrupt patterns on the surface including a plurality of overlapping, non-intersecting "C"-shaped sections.

10. A dummy circuit pattern as recited in claim 5, an interrupt pattern of the plurality of interrupt patterns on the surface including an interior configuration different than the plurality of segments.

11. A dummy circuit pattern formed on a surface of a substrate for a semiconductor package, comprising:
    a plurality of segments formed on the substrate; and
    a plurality of interrupt patterns for breaking up one or more of the plurality of segments, the plurality of interrupt patterns including a plurality of adjacent, non-intersecting arcuate shapes, no portion of the dummy circuit pattern being electrically isolated from another portion of the dummy circuit pattern.

12. A dummy circuit pattern as recited in claim 11, the plurality of adjacent, non-intersecting arcuate shapes including one or more "C"-shaped sections.

13. A dummy circuit pattern as recited in claim 12, the one or more "C"-shaped sections including a first plurality of "C"-shaped sections aligned in a linear pattern across the dummy circuit pattern.

14. A dummy circuit pattern as recited in claim 13, the one or more "C"-shaped sections including a second plurality of "C"-shaped sections aligned in a linear pattern across the dummy circuit pattern, the linear pattern of the second plurality of "C"-shaped sections being spaced from and generally parallel to the linear pattern of the first plurality of "C"-shaped sections.

15. A dummy circuit pattern as recited in claim 11, the plurality of adjacent, non-intersecting arcuate shapes including a plurality of overlapping, non-intersecting "C"-shaped sections.

16. A dummy circuit pattern as recited in claim 11, the plurality of adjacent, non-intersecting arcuate shapes including a shape having two or more integrally formed arcs.

17. A dummy circuit pattern as recited in claim 11, wherein an arcuate shape of the plurality of adjacent, non-intersecting arcuate shapes includes an outline of material around an outer periphery of the arcuate shape, and a portion interior to the outline of material, the interior portion being at least partially devoid of material.

18. A dummy circuit pattern as recited in claim 11, wherein an arcuate shape of the plurality of adjacent, non-intersecting arcuate shapes is defined by an absence of material relative to surrounding portions of the plurality of segments.

19. A dummy circuit pattern formed on a surface of a substrate for a semiconductor package, comprising:
a plurality of segments formed on the substrate; and
a plurality of interrupt patterns for breaking up one or more of the plurality of segments, an interrupt pattern of the plurality of interrupt patterns including an interior pattern having a configuration different than a configuration formed by the plurality of segments allowing travel of an electric charge throughout the entire dummy circuit pattern.

20. A dummy circuit pattern as recited in claim 19, the interior pattern including a plurality dots formed by material left on the substrate after a process for removing select portions of the material.

21. A dummy circuit pattern as recited in claim 20, wherein the plurality of dots include at least one of a circular shape, oval shape, elliptical shape, polygon shape and irregular shape.

22. A dummy circuit pattern as recited in claim 20, wherein the plurality of dots include at least one dot having at least a portion of the material removed from within an outer penmeter of the at least one dot.

23. A dummy circuit pattern as recited in claim 19, the interior pattern including a crosshatch pattern.

24. A dummy circuit pattern as recited in claim 23, the crosshatch pattern having at least one axis parallel to an axis of the plurality of segments.

25. A dummy circuit pattern as recited in claim 23, the crosshatch pattern having no axis parallel to an axis of the plurality of segments.

26. A dummy circuit pattern as recited in claim 19, wherein a shape of the interrupt pattern is defined by an outline of material around an outer periphery of the arcuate shape.

27. A dummy circuit pattern as recited in claim 19, wherein a shape of the interrupt pattern is defined by an absence of material relative to surrounding portions of the plurality of line segments.

28. A semiconductor package, comprising:
a semiconductor die; and
a substrate on which the semiconductor die is mounted, the substrate including a conductance pattern and a dummy circuit pattern, the dummy circuit pattern including:
a plurality of segments; and
a plurality of interrupt patterns for breaking up one or more of the segments, the plurality of interrupt patterns allowing travel of an electric charge throughout the entire dummy circuit pattern.

29. A semiconductor package as recited in claim 28, wherein portions of the dummy circuit pattern are connected to at least one of ground potential and power potential.

30. A semiconductor package as recited in claim 28, wherein portions of the dummy circuit pattern are connected to at least one of a semiconductor die and electrical components on the substrate to carry electrical signals to and/or from at least one of the semiconductor die and electrical components on the substrate.

31. A semiconductor package as recited in claim 28, wherein portions of the dummy circuit pattern are floating.

32. A semiconductor package as recited in claim 28, the plurality of interrupt patterns on the surface including one or more arcuate shapes.

33. A semiconductor package as recited in claim 28, an interrupt pattern of the plurality of interrupt patterns on the surface including an interior configuration different than the plurality of segments.

34. A semiconductor package as recited in claim 28, the plurality of interrupt patterns on the surface having no straight segments parallel an axis of an edge of the semiconductor die associated with the substrate.

35. A semiconductor package as recited in claim 28, the semiconductor package comprising a flash memory.

36. A semiconductor package as recited in claim 28, the semiconductor package comprising a controller chip.

* * * * *